United States Patent [19]
Matsuoka et al.

[11] Patent Number: 5,234,349
[45] Date of Patent: Aug. 10, 1993

[54] SOCKET FOR THE USE OF ELECTRIC PART

[75] Inventors: Noriyuki Matsuoka, Yokohama; Masanori Egawa, Sendai, both of Japan

[73] Assignee: Yamaichi Electric Co., Ltd., Ohta, Japan

[21] Appl. No.: 877,982

[22] Filed: May 4, 1992

[30] Foreign Application Priority Data

May 2, 1991 [JP] Japan .................................. 3-130460

[51] Int. Cl.$^5$ ............................................ H01R 9/09
[52] U.S. Cl. ...................................... 439/70; 439/331; 439/526
[58] Field of Search ................ 439/70, 71, 72, 73, 439/330, 331, 525, 526

[56] References Cited

U.S. PATENT DOCUMENTS

| | | | |
|---|---|---|---|
| 4,699,593 | 10/1987 | Grabbe et al. | 439/71 |
| 4,789,345 | 12/1988 | Carter | 439/71 |
| 4,846,703 | 7/1989 | Matsuoka et al. | 439/73 X |
| 5,062,802 | 11/1991 | Grabbe | 439/72 |

Primary Examiner—Larry I. Schwartz
Assistant Examiner—Khiem Nguyen
Attorney, Agent, or Firm—Wenderoth Lind & Ponack

[57] ABSTRACT

Partition walls disposed between adjacent contacts are formed as parts separate from a socket board. One or both ends of the partition walls are slip fitted into a socket board or an operating member so as to be held by the socket board. The partition walls and elastic contact elements of the contacts are coincidently displaced.

8 Claims, 11 Drawing Sheets

SOCKET FOR THE USE OF ELECTRIC PART

BACKGROUND OF THE INVENTION

This invention relates to a socket used for measuring or mounting an electric part such as an IC, and more particularly to a construction of a partition wall disposed between adjacent contacts formed on the socket.

A socket of the type described above has a plurality of contacts arranged at micro pitches so as to correspond to terminals of an IC. Therefore, the adjacent contacts must be isolated by a partition wall in order to prevent a short circuit. In a conventional socket of this type, as shown in FIG. 16, the partition walls 2 are integrally formed on a socket board 1, and each of the contacts 3 is mounted between adjacent partition walls 2.

Each of the partition walls is disposed in a very limited space between the adjacent IC terminals, and between the adjacent contacts, both being arranged at micro pitches. Since each of the partition walls requires, at each side thereof, a narrow space just sufficient to avoid frictional engagement with the adjacent contacts, it is necessary to give the partition walls on extremely small wall thickness.

In recent years, there is a tendency that the IC terminals are arranged at smaller pitches, and therefore, each of the partition walls is required to be made still thinner. However, since there is a limit as to how thin the partition walls can be made, it becomes extremely difficult by the current molding technique to integrally form strong partition walls thin enough to meet the aforementioned requirement.

As one solution for the above problem, it can be considered forming each of the insulating partition walls as a separate part from the socket board, and each partition wall is mounted on the socket board after the contacts are mounted in the socket board. However, because each of the partition walls is a separate part, it becomes a problem whether a means for mounting the partition walls on the socket board can be provided or not. For example, one idea, in which a plurality of holes for implanting the partition walls is formed in the socket board at micro pitches beforehand, is likewise hardly employable because it will have the same difficulties as the arrangement in which the very thin partition walls are arranged on the socket board at micro pitches.

SUMMARY OF THE INVENTION

It is therefore an object of the present invention to provide a socket for mounting an electric part, in which each of the partition walls is formed as a separate part from a socket board so that the partition walls can be made sufficiently thin, and such partition walls can be properly mounted on the socket board in order to function properly.

To achieve the above object, according to one aspect of the present invention, there is provided a socket for mounting an electric part, in which insulating partition walls are formed as separate parts from a socket board, and one end portions of the insulating partition walls are engaged with and held by the socket board.

As another aspect of the present invention, there is also provided a socket for mounting an electric part, in which insulating partition walls are formed as separate parts from a socket board, and elastic contact pieces of the contacts to be contacted with terminals of the electric part under pressure and the partition walls are held by the socket board such that the elastic contact pieces and partition walls will be displaced properly.

As a further aspect of the present invention, there is also provided a socket for mounting an electric part, in which unit partition walls having different lengths are formed, and one end portion of a partition wall having a long length and one end portion of a partition wall having a short length are alternately engaged with corresponding separate groove formed in the socket board so as to be held by the socket board.

As still further aspect of the present invention, there is also provided a socket for mounting an electric part, in which the end portions of the unit partition walls having long and short lengths are slip fitted in an operating member, which is displaced coincident with the elastic contact pieces of the contacts, so as to be correctly positioned, and unit partition walls are displaced coincident to the operating member and the elastic contact pieces.

According to the present invention, each of the insulating partition walls, which is formed as a separate part from the socket body, is disposed between adjacent contacts, and the ends of the partition walls are engaged with and held by the socket board. Owing to the foregoing arrangement, each of the partition walls can be properly held by the socket board without being forced into the socket board under pressure.

Also, according to the present invention, the elastic contact pieces of the contacts to be contacted with the terminals of the electric part, and the partition walls are coincidently displaced. Therefore, when the elastic contact pieces are displaced, the frictional resistance between the elastic contact pieces and the partition walls can be reduced. Furthermore, the elastic contact pieces and the partition walls can be positioned as close as possible with respect to each other, and therefore, the partition walls can be arranged at micro pitches, and also can be given a large wall thickness. Moreover, an increase in the required displacement force of the contacts caused by the frictional resistance of the partition walls can be prevented effectively.

Furthermore, according to the present invention, the partition walls are displaced coincident with the operating member which is displaced together with the elastic contact pieces of the contacts. Therefore, the coincident displacement can be obtained without fail.

In addition, according to the present invention, the unit partition walls in a group have different lengths. The unit partition walls having a long length and the unit partition walls having a short length are correctly positioned by the unit grooves having different phases formed either in the operating member or in the socket board. Therefore, a sideward displacement of the contacts due to accumulated errors can be prevented, and the partition walls and the elastic contact pieces can be arranged in proper position, so that the properly face the corresponding terminals of the electric part.

DETAILED DESCRIPTION OF THE EMBODIMENTS

The present invention will now be described with reference to the embodiments shown in the accompanying drawings.

Figure 5:
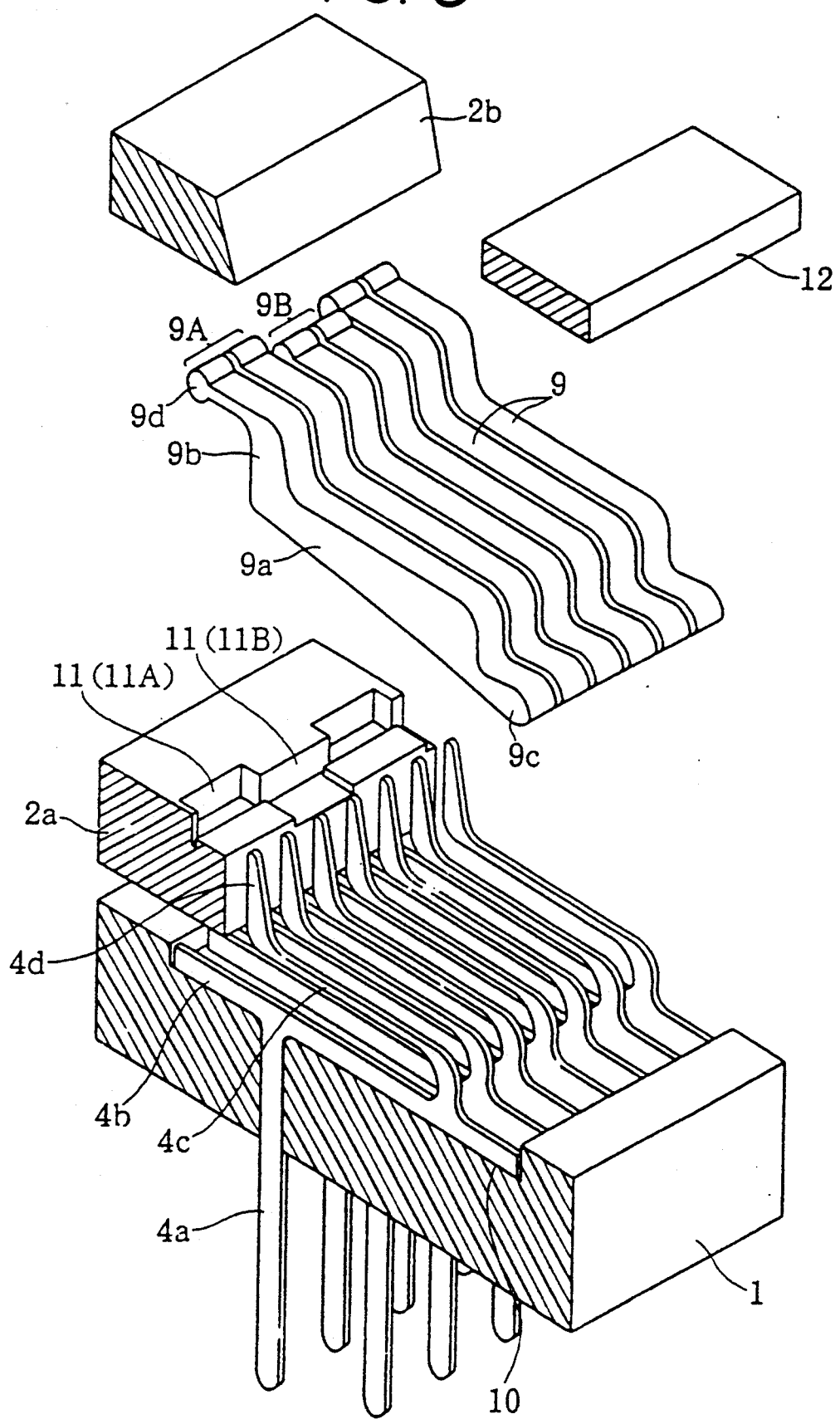
FIG. 5 is an exploded perspective view showing important portions of the socket of FIGS. 1 and 2.
Figure 6:
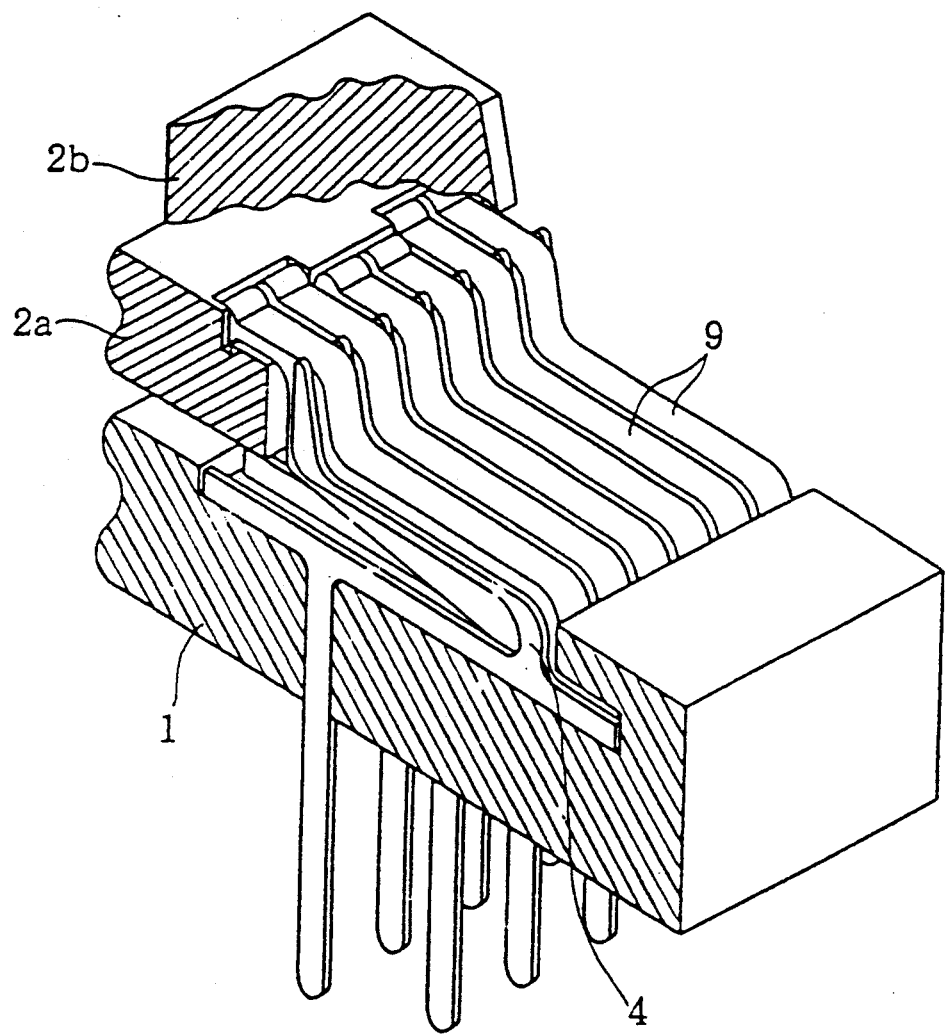
FIG. 6 is a perspective view, partly cut-away, of the socket, but with the parts of FIG. 5 assembled.
Figure 7:
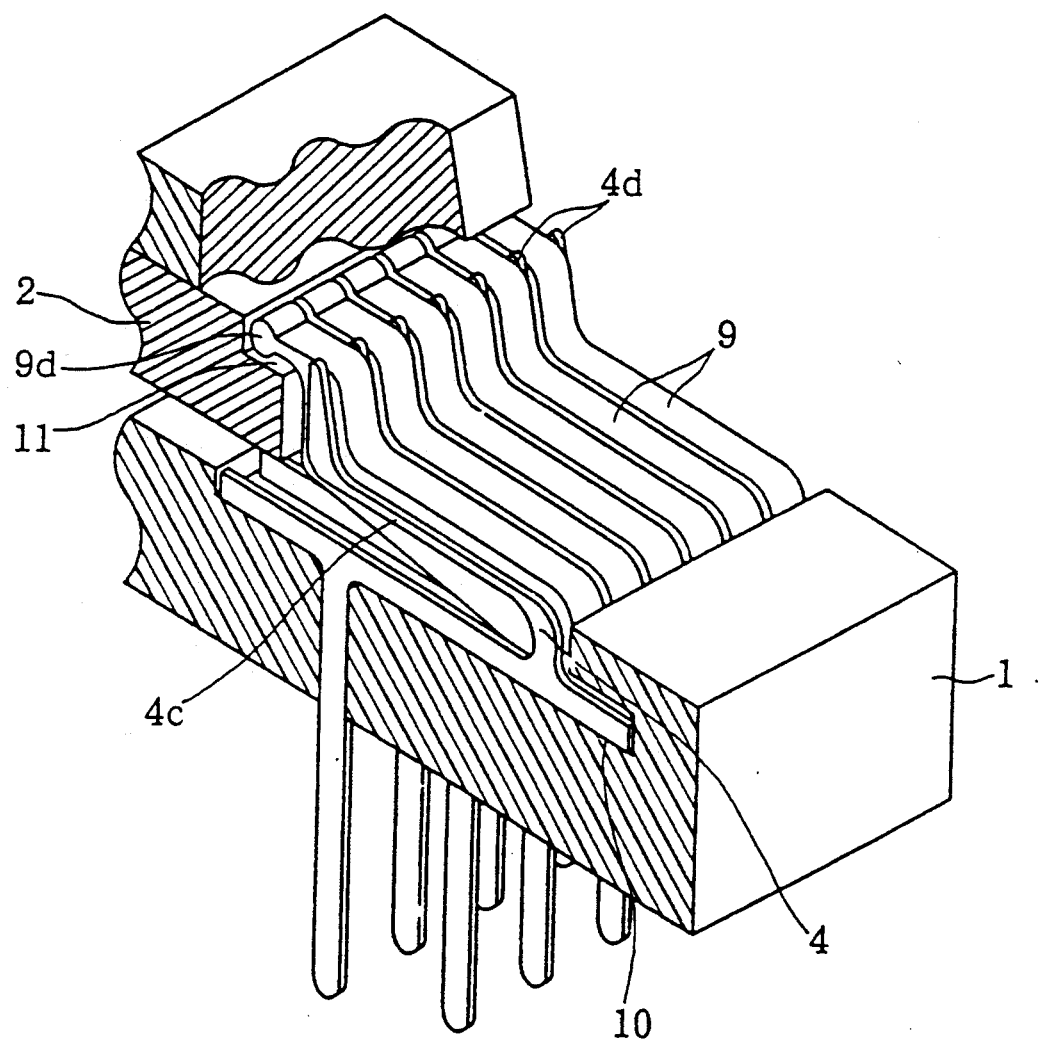
FIG. 7 is a perspective view, partly cut-away, of an important portion of a socket according to another embodiment of the present invention.
Figure 8:
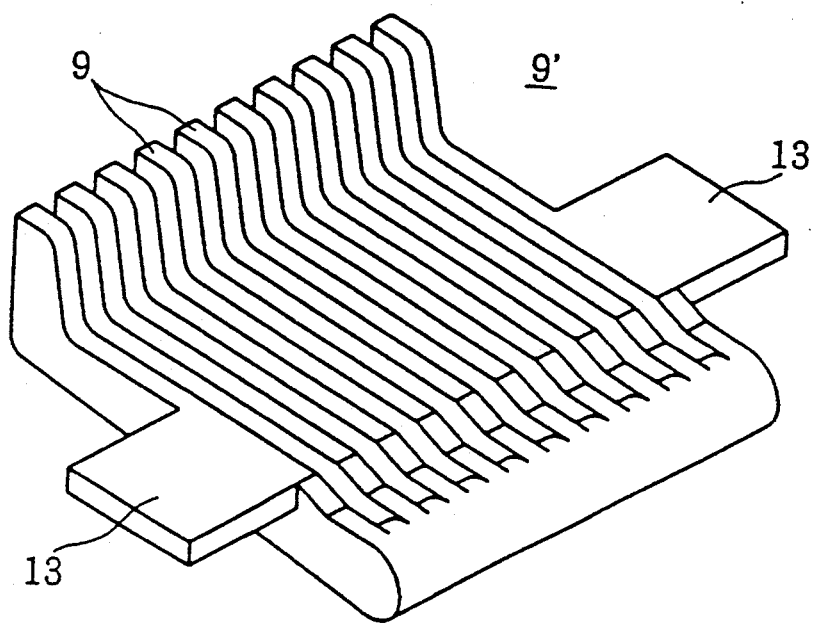
FIG. 8 is a perspective view showing a modified partition wall unit according to the present invention.
Figure 9:
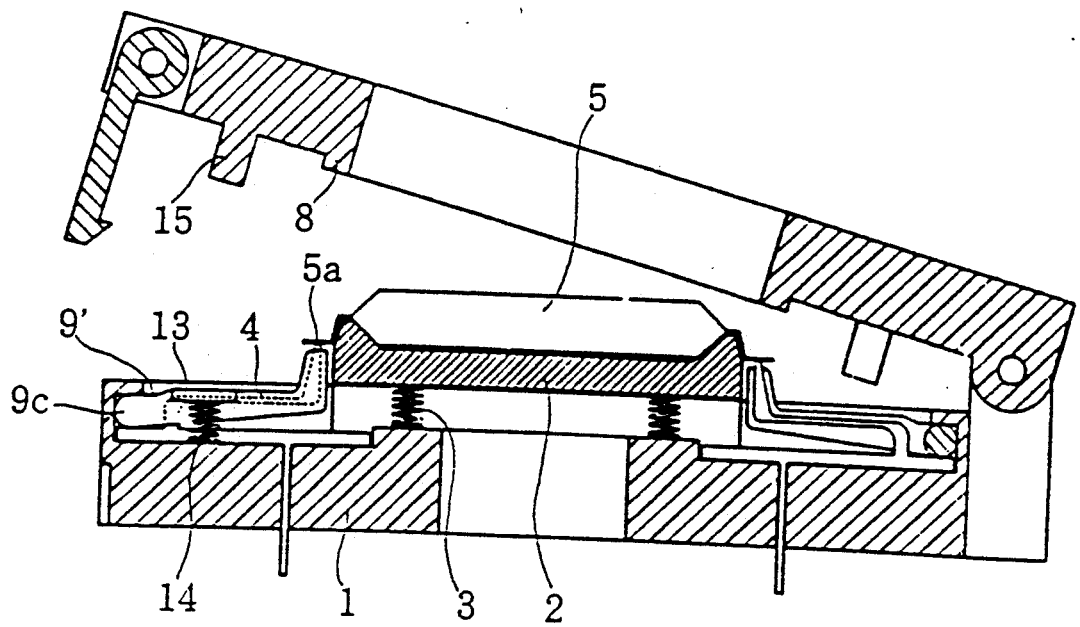
FIG. 9 is a sectional view of a socket like that of FIGS. 1 and 2, but showing a state where the partition wall unit of FIG. 8 is mounted on the socket board and the terminals of the electric parts are not yet brought into pressure contact with the contacts.
Figure 10:
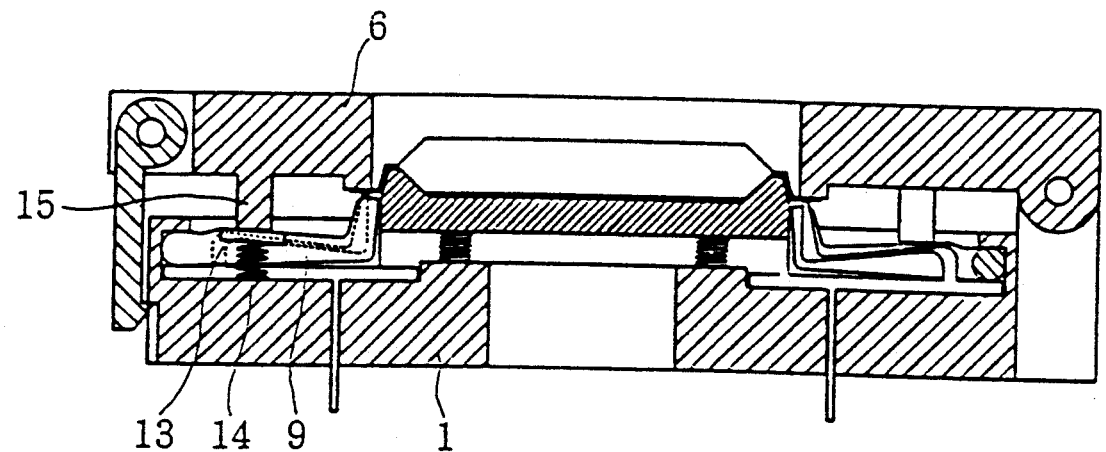
FIG. 10 is a sectional view of a socket like that of FIGS. 1 and 2, but showing another state where a terminal of the electric part is in pressure contact with a contact of the socket.
Figure 11:
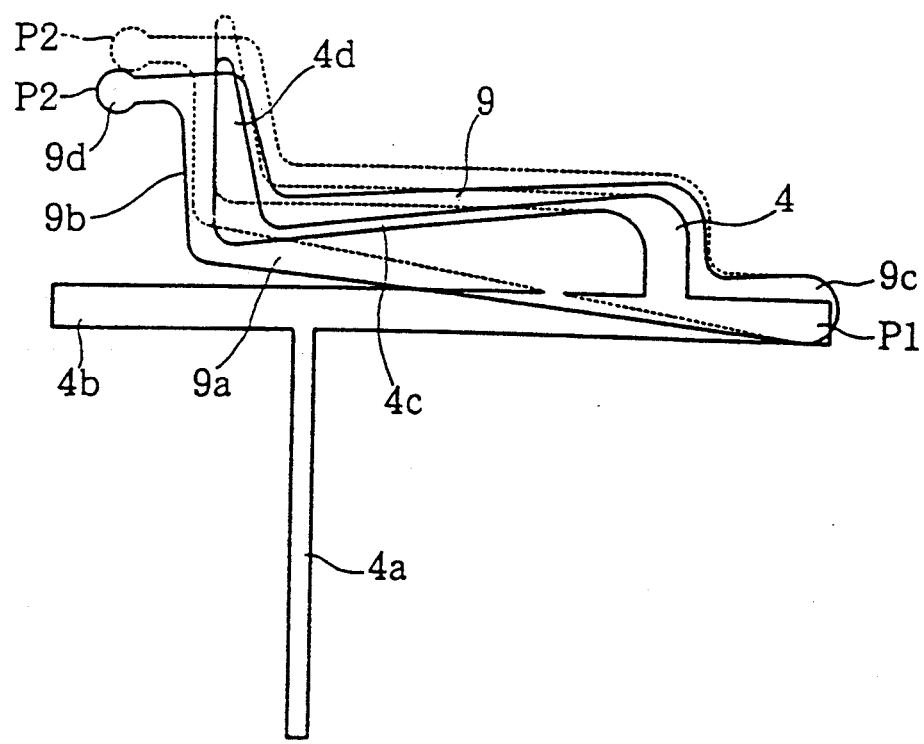
FIG. 11 is a side view for explaining a displacement action of the elastic contact piece of the contact and the partition wall.
Figure 12:
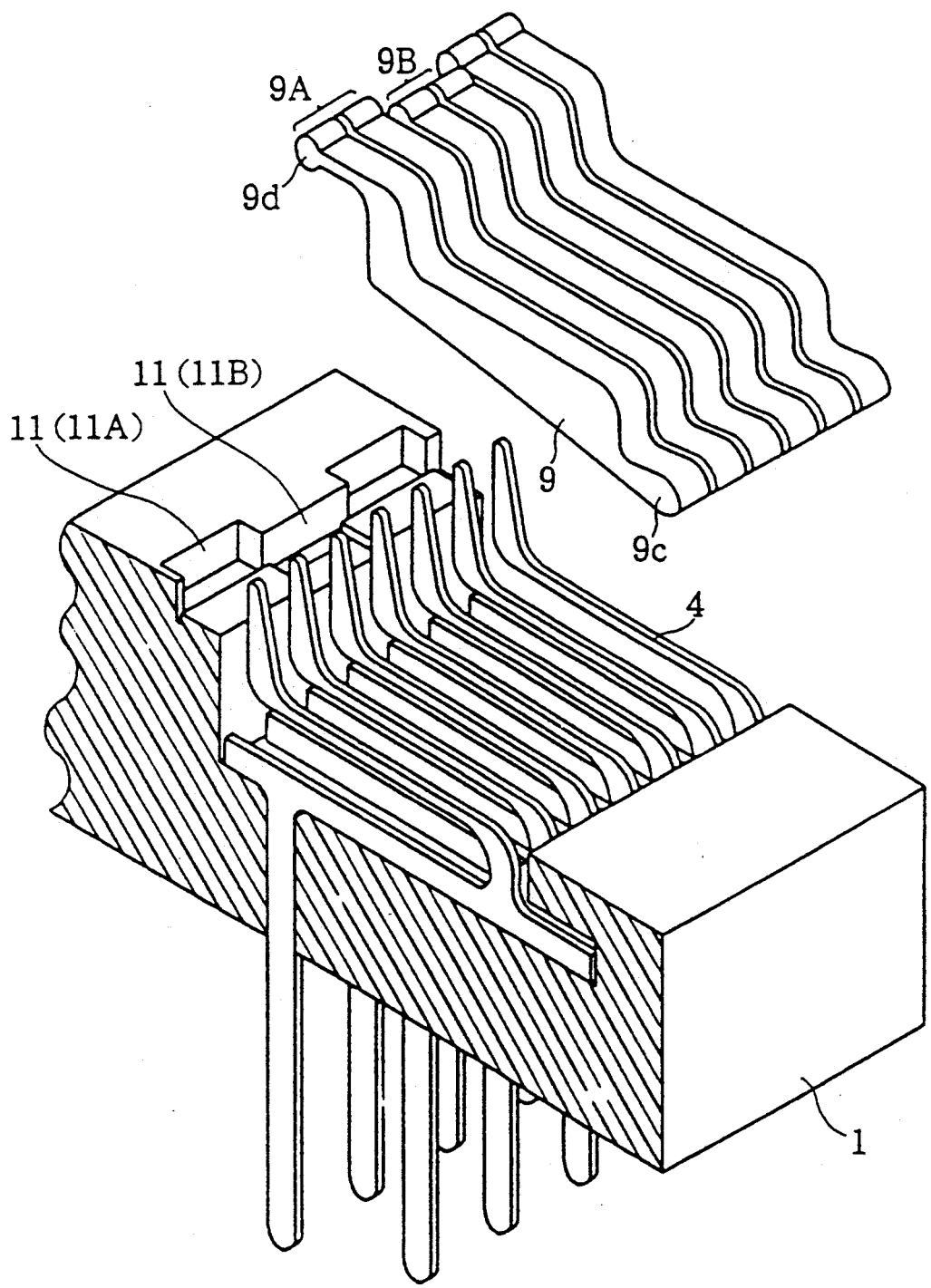
FIG. 12 is an exploded perspective view of an important portion of a socket according to a further embodiment of the present invention, with the partition walls removed therefrom.
Figure 13:
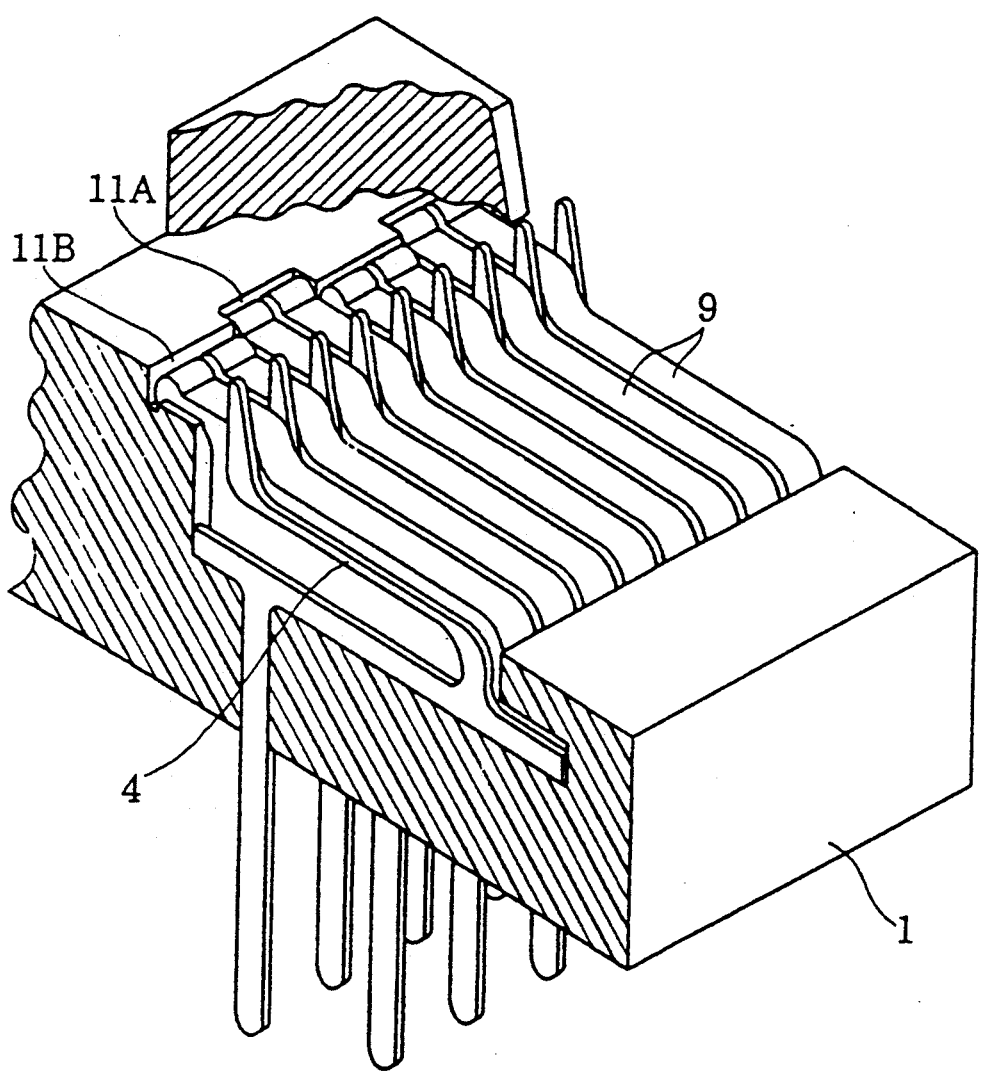
FIG. 13 is a perspective view, partly broken away, of the socket of FIG. 12 with the partition walls mounted on the socket.
Figure 14:
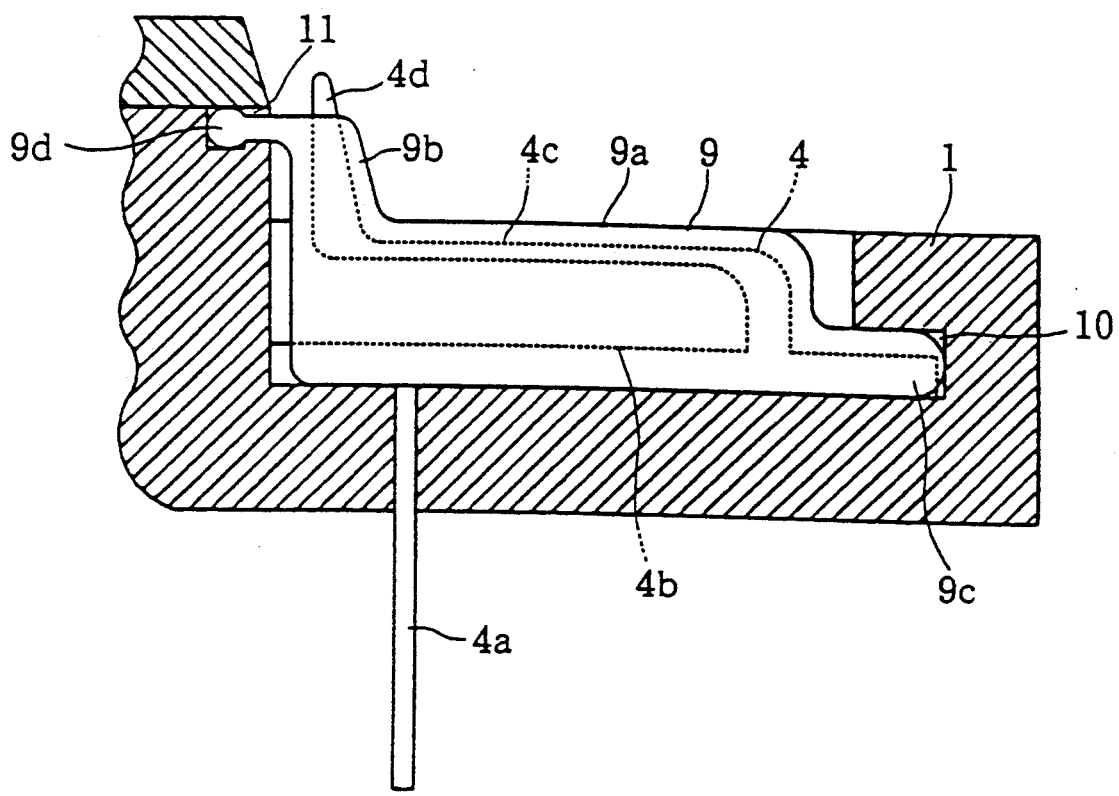
FIG. 14 is a sectional view of the socket of FIG. 12.
Figure 15:
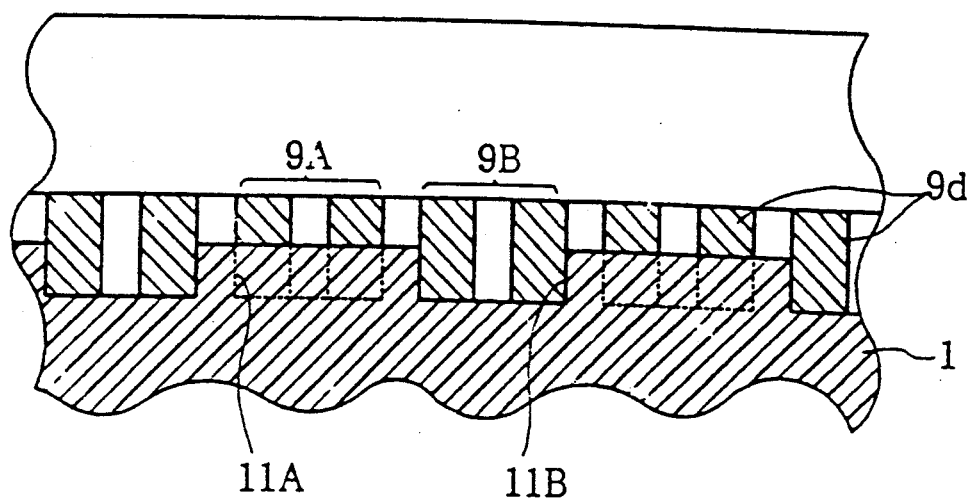
FIG. 15 is a sectional view of an important portion of the socket of FIG. 12, showing a slip fitted state of a front end link portion of the partition wall and the front groove.
Figure 16:
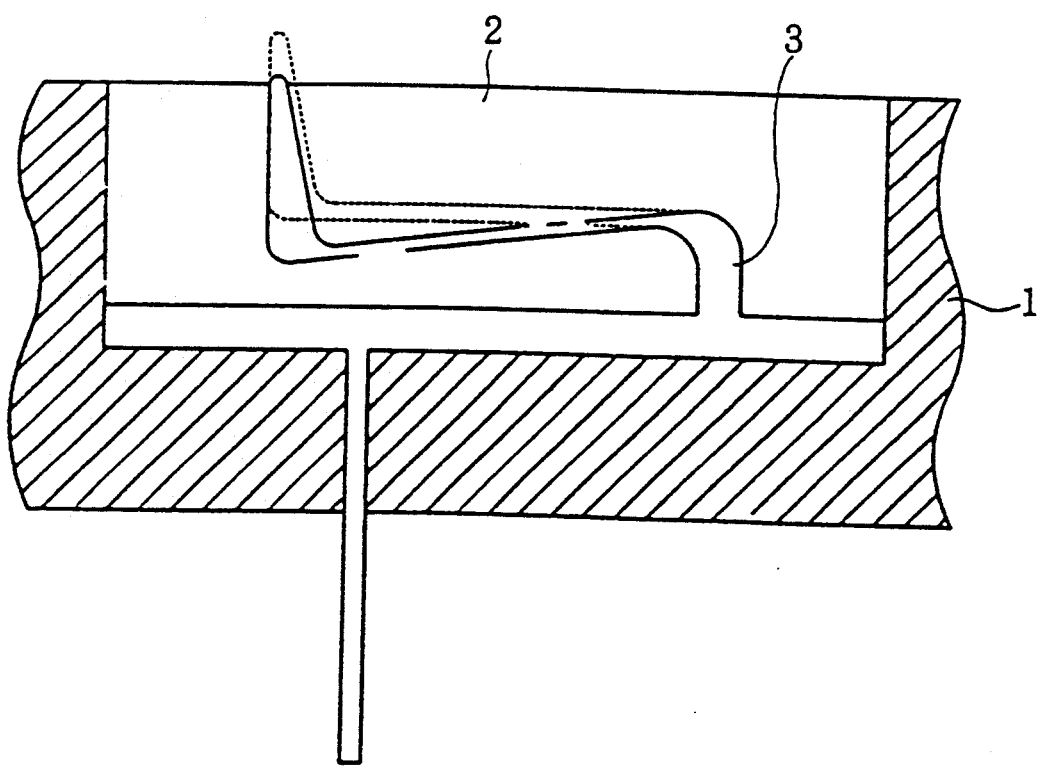
FIG. 16 is a sectional view showing an arrangement of partition walls and contacts according to the prior art.

FIGS. 1 through 6 show an embodiment of a socket for an electric part in which partition walls are displaceably held by a socket board, FIG. 7 shows a socket for an electric part according to another embodiment in which partition walls are displaceably held by the socket board, FIGS. 8 through 10 show a socket for an electric part according to an embodiment in which a group of partition walls are made as a unit and held by the socket board, FIG. 11 is an explanatory view for explaining the displacing actions of the partition walls and the contacts in the above embodiments, FIGS. 12 through 15 show a socket for an electric part according to a further embodiment in which the partition walls are non-displaceably held by the socket body, and FIG. 16 shows a conventional socket for an electric part in which there are shown a partition wall integrally formed on a socket body and a contact mounted in the socket body.

The embodiment shown in FIGS. 1 through 6 will be described first.

The numeral 1 denotes a socket board formed of an insulator material. The socket board 1 has a space formed in a central portion thereof and adapted to receive an electric part therein. A rectangular electric part supporting platform 2 is disposed in the electric part receiving space. A spring 3 for pushing up a lower surface of the electric part platform 2 is disposed between the platform 2 and the socket board 1. The platform 2 is displaceable downward while compressing the spring 3, and is displaced upwardly by the restoring force of the spring 3. A number of contacts are mounted in array along two sides or four sides of the electric part receiving space (that is, the electric part platform 2). Each of the contacts 4 has a male terminal 4a and is mounted on the socket board 1 by the male terminal 4a extending through the socket board 1. Each of the contacts 4 also has a seat element 4b disposed at an upper end of the male terminal 4a and extending along the surface of the socket board 1. Each of the contacts 4 also has an elastic contact element 4c extending upwardly from the seat element 4b and extending laterally toward the electric part platform 2. A contact portion 4d projecting upwardly is formed on a free end of the elastic contact element 4c.

Figure 1:
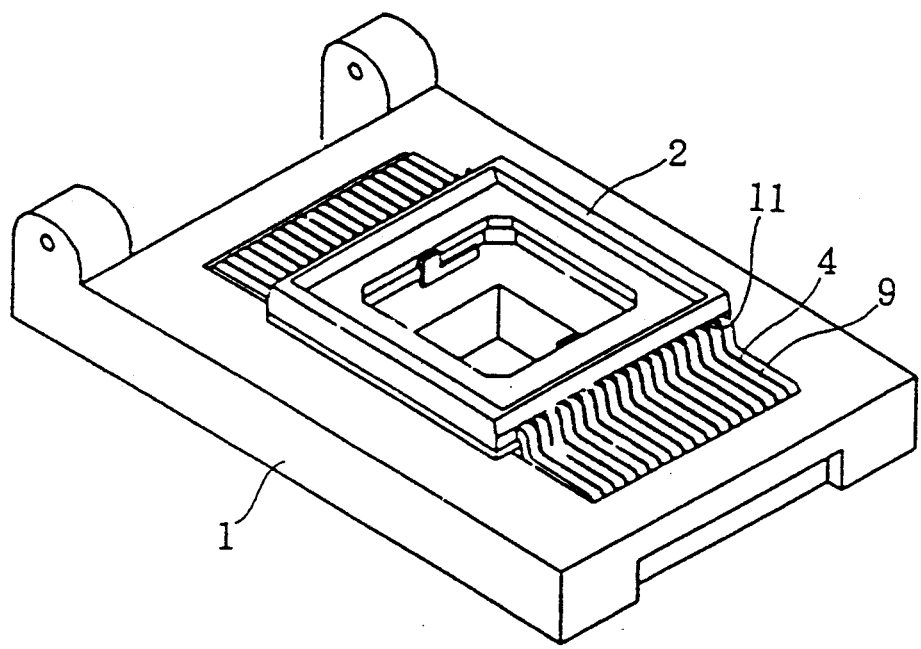
FIG. 1 is a perspective view of a socket for an electric part according to one embodiment of the present invention.
Figure 2:
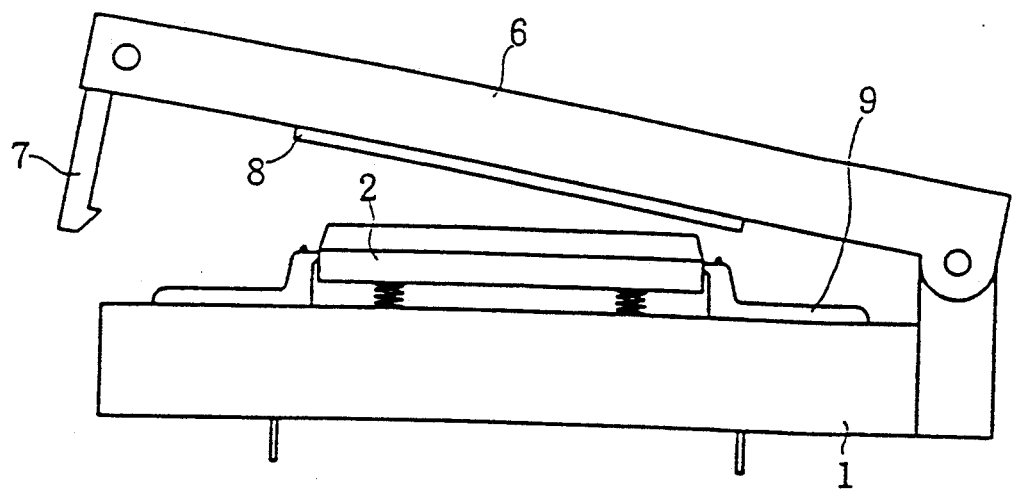
FIG. 2 is a side view of the socket of FIG. 1 but with a presser cover connected thereto.
Figure 3:
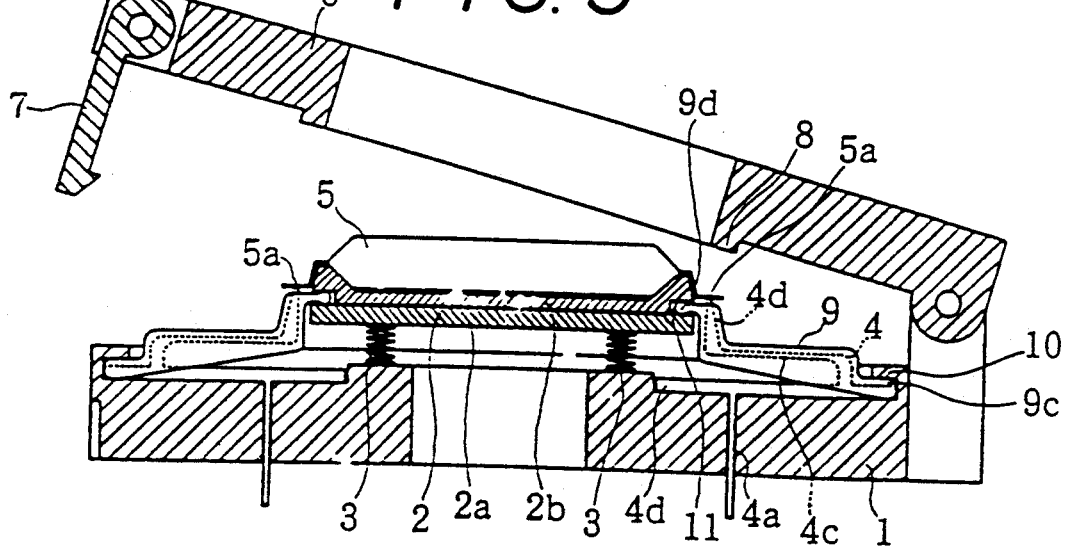
FIG. 3 is a sectional view of the socket of FIGS. 1 and 2, but showing the socket in a state where the contact is not yet brought into pressure contact with a terminal of the electric part.
Figure 4:
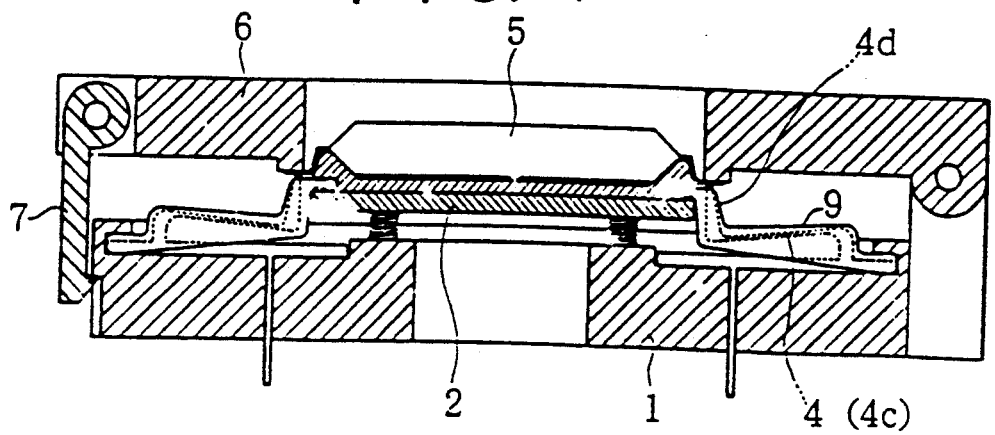
FIG. 4 is likewise a sectional view of the socket of FIGS. 1 and 2, but showing another state where the contact is in pressure contact with the terminal of the electric part.

As shown in FIGS. 2 and 3, the electric part 5 is placed on the platform 2 with a number of terminals 5a resting on the contact portions 4d of the elastic contact elements 4c, and as shown in FIG. 4, the electric part 5 is pushed down together with the platform 2 while compressing the spring 3. As a result, each of the terminals 5a is urged against an elastic contact element 4c in order to displace the contact element 4c downward against the elasticity thereof, and the contact portion 4d and the terminal 5a are brought into pressure contact with each other by the restoring force.

The socket board 1 is provided with a presser cover 6 as a means for pushing or urging the terminals 5a against the contact portions 4c. One end of the presser cover 6 is pivotally supported by one end of the socket board 1 so that the cover 6 can be opened and closed, and the other end of the presser cover 6, in turn, pivotally supports a lock lever 7. When the presser cover 6 is closed on the socket board 1, the lock lever 7 is retained at the other end of the socket board 1 in order to maintain the closed condition. During the time when the presser cover 6 is closed on the socket board 1, the terminals 5a of the electric part 5 are urged against the contact portions 4d of the elastic contact elements 4c by a pillow-like pad 8 formed on and slightly projected from an inner surface of the presser cover 6 in order to hold the electric part 5 and to maintain the above pressure contact relation. When the is presser cover 6 is released, the platform 2 is restored to an upper position by the restoring force of the spring 3, thereby removing the pressure contact relation between the terminals 5a and the contacts 4. As a result, the electric part 5 can be removed form the socket.

The numeral 9 denotes insulating partition walls each of which is disposed between adjacent contact elements 4c. The partition walls are formed as a separate part from the socket board 1, and individually separately formed as shown in FIG. 5. Alternatively, as shown in FIG. 8, a group of partition walls 9 may be connected with each other at one ends thereof as will be described later. Although not shown, the one ends of the unit partition walls 9 may be connected with each other.

Each of the insulating partition walls 9 has a contact element isolating portion 9a disposed along each of the elastic contact elements 4c of the contacts 4, and a contact isolating portion 9b rising along each of the contact portions 4d. Each partition wall 9 has pivot portions 9c and 9d at opposite ends (rear end and front end) thereof. Each of the pivot portions 9c and 9c has an arcuate portion on its outer surface in order to enhance a smooth sliding pivotal movement thereof. As discussed above, the insulating partition walls 9 are mounted such that each of the insulating partition walls is located between adjacent elastic contact elements 4c, and the rear pivot portions 9c are pivotably slip fitted into corresponding grooves 10 extending in the direction of the contact array, and the front pivot portions 9d are likewise pivotably slip fitted into corresponding grooves 11 formed in a peripheral portion of the platform 2 and extending in the direction of the contact array, thereby disposing the partition walls 9 between the pivot portions 9c and 9d, so that each of the partition walls 9 is located between the adjacent elastic contact elements 4c.

Owing to the foregoing arrangement, as shown in FIG. 11, each of the partition walls 9 is held by the socket board 1 such that the partition wall 9 can be pivotally displaced upwardly and downwardly about the rear pivot portion 9c as a stationary fulcrum $P_1$ and also about the front pivot portion 9d as a floating fulcrum $P_2$. Therefore, the pivot portions 9c and 9d form joint portions of the partition wall 9.

More specifically, when the platform 2 is displaced downwardly while compressing the spring 3, the front pivot portion 9d of the partition wall 9 is also pushed downwardly and v=pivotally displaced about the rear pivot portion 9c as a stationary fulcrum. At the same time, the contact portion 4d is pushed downward by the terminal 5a of the electric part 5a, thereby flexing the elastic contact element 4c downwardly. As a result, the partition wall 9 is displaced downwardly coincident with the downward displacement of the elastic contact element 4c. The term "coincident with" does not refer to a complete synchronism but includes a modified embodiment, in which a small interval exits between the downward displacement and the upward displacement of the partition wall 9 and elastic contact element 4c of the contact 4.

As shown in FIGS. 3, 6, 11, etc., a front end portion of the contact portion 4d of the contact 4 slightly projects upwardly of the contact isolating portion 9b of the partition wall 9 so that the terminal 5a of the electric part can be processed thereon for contacting. However, the elastic contact element 4c of the contact 4 and the partition wall 9 are coincidently displaced downwardly as described, and therefore, the size of the projecting part of the contact portion 4d should be reduced as much as possible. As a result, there can be obtained a sufficient amount of downward displacement by the small projecting part of the contact portion 4d, thus enabling obtaining a contact pressure, too.

Since the amount the contact portion 4d projects is reduced as much as possible, the intended object (that is, insulation) to be achieved by a provision of the partition wall can be obtained effectively. Also, owing to the coincident displacement of the partition wall 9 and the elastic contact element 4c, the friction therebetween can be minimized.

For mounting the pivot portions 9c and 9d of the partition wall 9, a partition wall holding plate 12 capable of being mounted on the socket board to form the rear groove 10 is provided, and by mounting the partition wall holding plate 12 on the socket board 1, the rear groove 10 is formed. The platform 2 has a two-plate overlapping construction consisting of a lower plate, i.e., base plate 2a, and an upper plate, i.e., partition wall holding plate 2b. By overlapping the two plates 2a and 2b, the front groove 11 is formed between marginal portions of thereof.

For mounting the partition walls 9 on the socket board 1 as shown in FIG. 5, first, the contacts 4 are mounted in the socket board 1 in an array. Then,m as shown in FIG. 6, each of the partition walls 9 is disposed between contacts 4 (i.e., elastic contact elements 4c of pairs of adjacent contacts, and the pivot portions 9c and 9d are inserted into the grooves 10 and 11. Thereafter, the partition wall holding plates 12 and 2b are mounted to hold the partition walls 9.

FIGS. 1 through 7 clearly show one example of the present invention, in which the front pivot portions 9d of the partition walls 9 are engaged with the platform 2 which can be considered one form of an operating member. In FIGS. 5 through 7, the parts 2a and 2b can be any operating member which is capable of moving upward and downward, of which the platform 2 in FIGS. 1-4 is one example. The present invention includes a modified embodiment, in which the grooves 11 are formed in such an operating member, and the front pivot portions 9d of the partition walls 9 are slip fitted into grooves 11 therein.

More specifically, in FIGS. 1 through 4, the platform 2 functions as a means for supporting the electric part 5 thereon on the one hand, and it functions as the operating member for displacing the partition walls 9 upwardly and downwardly on the other hand. A socket, which is not provided with the platform 2, may be provided with another form of operating member. In such case, for example, the operating member is formed as a two-plate overlapping construction consisting of the base plate 2a and the partition wall holding plate 2b, and the grooves 11 are formed in the upper surface of base plate 2a, so that the front pivot portions 9d of the partition walls 9 can be slip fitted in the grooves 11.

FIG. 7 shows another example of the present invention, in which the front ends of the partition walls 9 in one group are all the same length, and slip fitted in the grooves 11. In contrast, FIGS. 5 and 6 show a positioning means for preventing a sideward displacement of the group of insulating partition walls 9. As illustrated, some of the partition walls 9 in one group have different lengths, and the partition walls having a long length and the partition walls having a short length are alternately arranged. The partition walls having along length and a short length are slip fitted in groove portions or unit grooves 11A and 11B having different offset positions in the upper surface of the platform 2 or of the operating member. In this embodiment, the partition walls have two different lengths.

In this way, the unit partition walls 9 of different lengths are engaged in the corresponding unit grooves 11A and 11B, so that the positions of the outer sides or faces of the unit partition walls 9A and 9B are regulated by the positions of the end faces of the unit grooves 11A and 11B. As a result, the partition walls can be accurately positioned for each partition wall. Any sideward displacement caused accumulated errors of the thickness of partition walls 9 or the sideward displacement, when in use, can be prevented. more specifically, if there is a dimensional error due to a manufacturing error (for example, an error in thickness) in the partition walls 9, these errors are accumulated so as to cause the side walls 9 and the elastic contact elements 4c of the contacts 4 to be displaced sideward, or the pivot portions 9c are displaced sideward when in use. As a result, there is a fear that a proper contact with terminals 5a is not produced.

The invention relating to the positioning of the partition walls is capable of effecting a correct positioning without changing the individual pitches of the adjacent partition walls 9. Thus, the above problems can be solved effectively. The rear ends of the unit partition walls 9A and 9B can be integrally connected with each other per unit partition wall. Of course, the rear ends of all the partition walls can be connected with each other, as shown in FIG. 8.

FIGS. 8 through 10 show a further embodiment, in which groups of partition walls 9 are connected with each other per each array. More specifically, the rear ends of the group of partition walls 9 in each array are connected to form a partition wall unit 9' by an integral molding. This partition wall unit (that is, unit consisting of one group of partition walls in each array) is mounted on the socket board 1 such that each of the partition walls is located between the adjacent contacts 4. This partition wall unit may be disposed across the socket board 1 and the platform 2 or other form of operating member, as tin the embodiments of FIGS. 1 through 7.

In FIGS. 9 and 10, the partition wall unit 9' is not connected to the operating member, but is slip fitted into the grooves 10 on the side of the socket board 1, so that each of the partition walls will be located between adjacent contacts. In this case, as shown in FIG. 8, a spring engaging portion 13 is disposed on each side (right and left) of the partition wall unit 9', and the spring bearing portion 13 is resiliently supported by springs 14 on the socket board 1 so that the partition wall unit 9' can be displaced downward coincident with the contacts while compressing the springs 14, and restored to an upper position by restoring forces of the springs 14.

With reference to the means for restoring the individual partition walls 9 or partition wall unit 9', the elastic contact elements 4c of the contacts 4 may be connected to the partition walls 9 or partition wall unit 9', so that the partition walls 9 or partition unit 9' are restored to the upper position, without the use of the springs 3. For example, by provision of a means for retaining the individually separate partition walls 9 or integrated partitions wall unit 9' on the upper surfaces of the elastic contact elements 4c, the partition walls 9 or partition wall unit 9' can be displaced downwardly due to gravity and upwardly by the restoring forces of the elastic contact elements 4c.

In the embodiment of FIGS. 9 and 10, the partition walls of the partition wall unit 9' are displaced, as one group, upwardly by the springs 14, and displaced, as one group, downwardly against the springs 14.

The partition wall unit 9' is pushed downward at the same time the electric part 5 is pushed downward. For example, according to this embodiment, the presser cover 6 can be the operating member and be provided with a presser pad 8 adapted to push down the terminals 5a of the electric part 5, and a push-down portion 15 adapted to push down the partition wall unit 9', so that when the presser cover 6 is closed on the socket board 1, the terminals 5a of the electric part 5 and the spring engaging portion 13 which is also a pressure receiving portion (that is, a portion having both functions; one is a spring engaging function and the other is a pressure receiving function) is pushed down simultaneously. The above presser cover 6 is merely one example, and other means, such as a robot at the site, may, of course, be used as the press-down means.

FIGS. 12 through 15 show a still further embodiment, in which the partition walls 9 are not connected to the operating member such as the platform 2, but they are held by the socket board 1.

More specifically, as described above, each of the partition walls 9 is provided at respective ends thereof with the rear pivot portion 9c and the front pivot portion 9d. On the other hand, the socket board I is provided at a rear portion of the space for mounting the contacts with rear grooves 10 extending in the direction of the contact array, and at a front portion of the space with front grooves 11 likewise extending in the direction of the contact array, so that the front pivot portions 9d are engaged in the front grooves 11 and the rear pivot portions 9c are engaged in the rear grooves 10.

In the above embodiment, each of the partition walls 9, which is formed as a separate part, is disposed between adjacent contacts 4, and one or the both ends thereof is engaged with the socket board 1, so that the partition wall can be properly held by the socket board 1 without extending therethrough. Further, in the above embodiment, as in the embodiment of FIGS. 2 through 6, the insulating partition walls 9 have different lengths, and one ends of the partition walls 9A having a long length and one ends of the portion walls 9B having a short length are alternately arranged, so that they are engaged in the unit grooves 11A and 11B laterally offset from each other, thereby accurately positioning each wall.

According to the present invention, the partition walls, which are formed as separate parts from the socket board, can be properly held by the socket board without extending therethrough. In other words, it is not required to form holes for press fitting the partition walls therein beforehand. Therefore, the partition walls can be formed as separate parts with ease, and the desired micro pitches can be attained effectively.

Also, according to the present invention, by displacing the partition walls coincident with the elastic contact elements of the contacts, the frictional resistance between each of the partition walls and the adjacent contacts can be reduced at the time when the elastic contact elements are displaced, thus making it possible to displace the group of contacts downwardly by a reduced push-down force. Moreover, by displacing the partition walls coincident with the elastic contact elements of the contacts, the projecting dimension of the contact portion of each of the elastic contact elements projecting above each of the partition walls can be minimized. Therefore, the contacts can be effectively insulated by the partition walls.

Furthermore, even if the projecting dimension of the contact portion is minimized, a sufficient displacing amount can be obtained. Therefore, the proper contact pressure between the terminals of the electric part and the contact portions of the contacts can be obtained, and the partition walls can be located closer to the sides of the elastic contact elements, thus making it possible to increase the thickness of the partition walls and yet to attain the desired micro pitches. In addition, by arranging the partition walls and the elastic contact pieces in proximate relation, the sideward play of the elastic contact elements between the adjacent partition walls can be prevented effectively, thus enhancing the positioning effect of the contacts by the partition walls.

Furthermore, according to the present invention, the partition walls have different lengths, and the partition walls having a long length and the partition walls having a short length are positioned in unit grooves formed in the operating member or socket board and laterally offset. Therefore, the sideward displacement of the contacts due to accumulated sideward dimensional errors of the group of partition walls can be prevented effectively, and each of the partition walls and each of the elastic contact elements can be arranged in proper positions. As a result, the elastic contact elements of the contacts can be made to properly face the terminals of the electric part.

Moreover, there can be effectively obviated such inconvenience that the partition walls, which are formed as separate parts, are displaced sidewardly during use to cause the elastic contact elements of the contacts to be displaced sidewardly.

What is claimed is:

1. A socket for receiving an electric part having terminals thereon, comprising:

a socket board made of an electrically insulating material and having a plurality of resilient electrical contacts thereon mounted side by side in an array on an upper surface of said socket board for being contacted by the terminals of an electric part and moved toward said socket board against the resilience of said electrical contacts when the electric part is received on said socket board, said contacts being supported only by said socket board against the force of the moving terminals of the electric part;

a plurality of partition walls made of electrically insulating material, one positioned between each two adjacent contacts and electrically insulating said contacts from each other, said partition walls being separate elements from said socket board and being movable separately from each other, each partition wall having one end engaged with and movably held by said socket board.

2. A socket as claimed in claim 1 in which said contacts have a shape for, when an electric part is received on said socket board, a portion of each of said contacts is moved against the resiliency of the contact as said contacts are contacted by the terminals of the electric part for obtaining good electrical contact, and said one ends of said partition walls are engaged with and movably held by said socket board for being moved coincident with the movement of said portions of said contacts as said contacts are contacted by the terminals of the electric part.

3. A socket as claimed in claim 2 in which said socket further comprises an operating member movable with an electric part as the electric part is received on said socket board, said operating member being engagable with said partition walls for moving said partition walls coincident with the movement of said portions of said contacts as said contacts are contacted by the terminals of the electric part.

4. A socket as claimed in claim 3 in which said partition walls have other ends at the opposite end thereof from said one ends, said other ends being pivotally mounted in said operating member.

5. A socket as claimed in any one of claims 2, 3 or 4 in which at least some of said partition walls have different lengths than the remainder of said partition walls, and said socket board has groove means therein in which said one ends of said partition walls are pivotally mounted, said groove means having groove portions laterally offset from the remainder of said groove means, said one ends of said some of said partition walls being mounted in said laterally offset groove portions and the one ends of said remainder of said partition walls being mounted in said groove means.

6. A socket as claimed in any one of claims 3 or 4 in which at least some of said partition walls have different lengths than the remainder of said partition walls, and said operating member has groove means therein in which said other ends of said partition walls are pivotally mounted, said groove means having groove portions laterally offset from the remainder of said groove means, said other ends of said partition walls being mounted in said laterally offset groove portions and the other ends of the remainder of said partition walls being mounted in said groove means.

7. A socket for receiving an electric part having terminals thereon, comprising:

a socket board made of an electrically insulating material and having a plurality of resilient electrical contacts thereon mounted side by side in an array on an upper surface of said socket board for being contact by the terminals of an electric part and moved toward said socket board against the resiliency of said electrical contacts when the electric part is received on said socket board, said contacts being supported only by said socket board against the force of the moving terminals of the electric part;

plurality of partition walls made of electrically insulating material, one positioned between each two adjacent contacts and electrically insulating said contacts from each other, said partition walls being separate elements from said socket board;

an operating member movable with an electric part as the electric part is received on said socket board, each of said partition walls having the ends pivotally mounted in at least one of said socket board and said operating member, said operating member being engagable with said partition walls for moving said partition walls coincident with the movement of said portions of said contacts as said contacts are contacted by the terminals of the electric part.

8. The socket as set forth in any one of claims 1, 8, 9 or 13, wherein at least some of said partition walls are connected at their respective said one ends so as to be fixed and movable together.

* * * * *